US006989321B2

(12) United States Patent
Yamasaki et al.

(10) Patent No.: US 6,989,321 B2
(45) Date of Patent: Jan. 24, 2006

(54) LOW-PRESSURE DEPOSITION OF METAL LAYERS FROM METAL-CARBONYL PRECURSORS

(75) Inventors: Hideaki Yamasaki, Kofu (JP); Tsukasa Matsuda, Yamanashi (JP); Atsushi Gomi, Yamanashi (JP); Tatsuo Hatano, Ryuo (JP); Masahito Sugiura, Minami-Alps (JP); Yumiko Kawano, Kofu (JP); Gert J Leusink, Saltpoint, NY (US); Fenton R McFeely, Ossining, NY (US); Sandra G. Malhotra, Beacon, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/673,908

(22) Filed: Sep. 30, 2003

(65) Prior Publication Data
US 2005/0070100 A1 Mar. 31, 2005

(51) Int. Cl.
*H01L 21/20* (2006.01)
*H01L 21/44* (2006.01)
(52) U.S. Cl. ..................................... 438/584; 438/685
(58) Field of Classification Search ............... 438/584, 438/685
See application file for complete search history.

(56) References Cited

U.S. PATENT DOCUMENTS

| 4,619,840 | A |  | 10/1986 | Goldman et al. |
| 5,789,312 | A |  | 8/1998 | Buchanan et al. |
| 5,853,804 | A |  | 12/1998 | Hansen |
| 6,091,122 | A |  | 7/2000 | Buchanan et al. |
| 6,218,301 | B1 |  | 4/2001 | Yoon et al. |
| 6,491,978 | B1 | * | 12/2002 | Kalyanam ............ 427/255.394 |
| 6,833,161 | B2 | * | 12/2004 | Wang et al. ................ 427/250 |
| 2002/0190379 | A1 |  | 12/2002 | Jian et al. |
| 2003/0008070 | A1 |  | 1/2003 | Seutter et al. |

* cited by examiner

Primary Examiner—Scott Geyer
(74) Attorney, Agent, or Firm—Pillsbury Winthrop Shaw Pittman LLP

(57) ABSTRACT

A method for depositing metal layers on semiconductor substrates by a thermal chemical vapor deposition (TCVD) process includes introducing a process gas containing a metal carbonyl precursor in a process chamber and depositing a metal layer on a substrate. The TCVD process utilizes a short residence time for the gaseous species in the processing zone above the substrate to form a low-resistivity metal layer. In one embodiment of the invention, the metal carbonyl precursor can be selected from at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$ precursors. In another embodiment of the invention, a method is provided for depositing low-resistivity W layers at substrate temperatures below about 500° C., by utilizing a residence time less than about 120 msec.

32 Claims, 9 Drawing Sheets

LOW-PRESSURE DEPOSITION OF METAL LAYERS FROM METAL-CARBONYL PRECURSORS

FIELD OF THE INVENTION

The present invention relates to semiconductor processing, and more particularly, to a method for depositing metal layers in a thermal CVD process.

BACKGROUND OF THE INVENTION

The introduction of copper (Cu) metal into multilayer metallization schemes for manufacturing integrated circuits, can necessitate the use of diffusion barriers/liners to promote adhesion and growth of the Cu layers, and to prevent diffusion of Cu into the dielectric materials. Barriers/liners that are deposited onto dielectric materials can include refractive materials such as tungsten (W), molybdenum (Mo), and tantalum (Ta), that are non-reactive and immiscible with Cu and can offer low electrical resistivity. Current integration schemes that integrate Cu metallization and dielectric materials can require barrier/liner deposition processes at substrate temperatures between about 400° C. and about 500° C., or lower.

W layers can be formed by thermally decomposing a tungsten-containing precursor, e.g., a tungsten-carbonyl precursor, in a thermal chemical vapor deposition (TCVD) process. Material properties of W layers that are deposited by thermal decomposition of metal-carbonyl precursors (e.g., $W(CO)_6$), can deteriorate when the substrate deposition temperature is lowered to below about 500° C. Increase in the (electrical) resisitivity of the W layers and poor surface morphology (e.g., formation of nodules) at low deposition temperatures, has been attributed to increased incorporation of CO reaction by-products into the thermally deposited W layers. Both effects can be explained by a reduced CO desorption rate from the thermal decomposition of the tungsten-carbonyl precursor at substrate temperatures below about 500° C.

SUMMARY OF THE INVENTION

A method is provided for depositing a metal layer on a substrate in a process chamber by introducing a process gas comprising a metal-carbonyl precursor in the process chamber, creating a processing zone above the substrate, maintaining a residence time for gaseous species in the processing zone that is shorter than about 120 msec, and depositing a metal layer on the substrate by a thermal chemical vapor deposition process. The process gas can comprise a metal-carbonyl precursor selected from at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$, and the deposited metal layer can be at least one of W, Ni, Mo, Co, Rh, Re, Cr, and Ru, respectively.

A method is provided for depositing a W layer on a substrate in a process chamber by introducing a process gas comprising a $W(CO)_6$ precursor in the process chamber, creating a processing zone above the substrate, maintaining a residence time for gaseous species in the processing zone that is shorter than about 120 msec, and depositing W layer on the substrate by a thermal chemical vapor deposition process.

A processing system is provided for depositing a metal layer on a substrate. The processing system contains a process chamber, a substrate holder for receiving a substrate, a heater for heating the substrate, a precursor delivery system for introducing a process gas in the process chamber, wherein the process gas comprises a metal-carbonyl precursor, a processing zone in the process chamber, wherein the residence time for gaseous species is shorter than about 120 msec in the processing zone during thermal chemical vapor deposition of a metal layer on the substrate, and a controller for controlling the processing system.

DETAILED DESCRIPTION OF SEVERAL EMBODIMENTS

Figure 1:
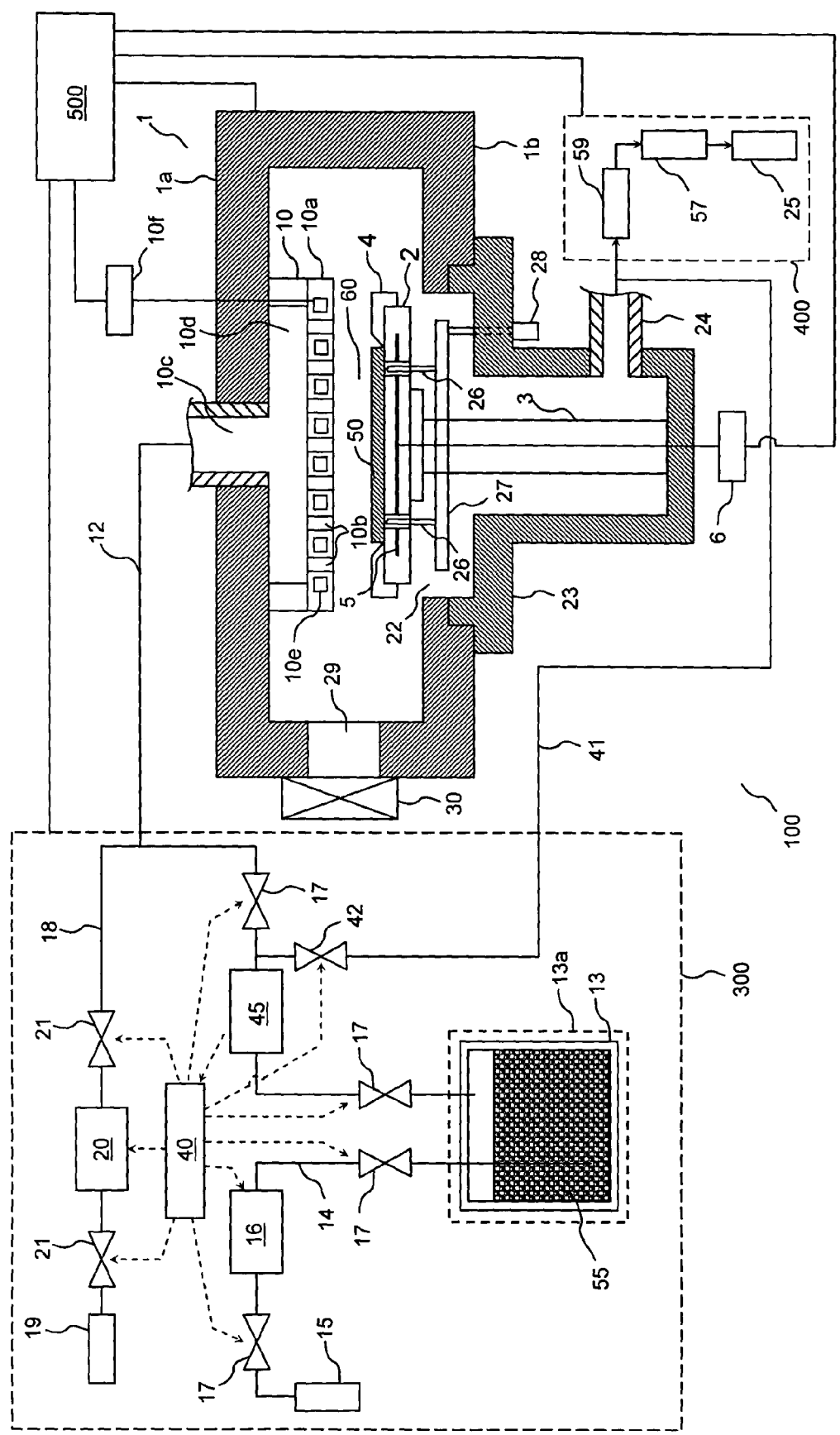
FIG. 1 is a simplified block-diagram of a processing system for depositing metal layers according to an embodiment of the invention.

FIG. 1 is a simplified block-diagram of a processing system for depositing metal layers according to an embodiment of the invention. The processing system 100 comprises a process chamber 1 that contains an upper chamber section 1a, a lower chamber section 1b, and an exhaust chamber 23. A circular opening 22 is formed in the middle of lower chamber section 1b, where bottom section 1b connects to exhaust chamber 23.

Provided inside process chamber 1 is a substrate holder 2 for horizontally holding a substrate (wafer) 50 to be processed. The substrate holder 2 is supported by a cylindrical support member 3, which extends upward from the center of the lower part of exhaust chamber 23. A guide ring 4 for positioning the substrate 50 on the substrate holder 2 is provided on the edge of substrate holder 2. Furthermore, the substrate holder 2 contains a heater 5 that is controlled by power source 6, and is used for heating the substrate 50. The heater 5 can be a resistive heater. Alternately, the heater 5 may be a lamp heater.

During processing, the heated substrate 50 can thermally decompose a $W(CO)_6$ precursor and enable deposition of a W layer on the substrate 50. The substrate holder 2 is heated to a pre-determined temperature that is suitable for depositing the desired W layer onto the substrate 50. A heater (not shown) is embedded in the walls of process chamber 1 to heat the chamber walls to a pre-determined temperature. The heater can maintain the temperature of the walls of process chamber 1 from about 40° C. to about 80° C.

A showerhead 10 is located in the upper chamber section 1a of process chamber 1. Showerhead plate 10a at the bottom of showerhead 10 contains multiple gas delivery holes 10b for delivering a process gas comprising the $W(CO)_6$ precursor into a processing zone 60 located above the substrate 50. The processing zone 60 is a volume defined by the substrate diameter and by the gap between the substrate 50 and the showerhead 10.

An opening 10c is provided in the upper chamber section 1b for introducing a process gas from gas line 12 into a gas distribution compartment 10d. Concentric coolant flow channels 10e are provided for controlling the temperature of the showerhead 10 and thereby preventing the decomposition of the $W(CO)_6$ precursor inside the showerhead 10. A coolant fluid such as water, can be supplied to the coolant flow channels 10e from a coolant fluid source 10f for controlling the temperature of showerhead 10 from about 20° C. to about 100° C.

The gas line 12 connects the precursor delivery system 300 to process chamber 1. A precursor container 13 contains a solid $W(CO)_6$ precursor 55, and a precursor heater 13a is provided for heating the precursor container 13 to maintain the $W(CO)_6$ precursor 55 at a temperature that produces a desired vapor pressure of the $W(CO)_6$ precursor. The $W(CO)_6$ precursor 55 can have a relatively high vapor pressure, $P_{vap}$~1 Torr at 65° C. Therefore, only moderate heating of the precursor source 13 and the precursor gas delivery lines (e.g., gas line 12) is required for delivering the $W(CO)_6$ precursor to the process chamber 1. Furthermore, the $W(CO)_6$ precursor does not thermally decompose at temperatures below about 200° C. This can significantly reduce decomposition of the $W(CO)_6$ precursor due to interactions with heated chamber walls and gas phase reactions.

In one embodiment, $W(CO)_6$ precursor can be delivered to the process chamber 1 without the use of a carrier gas or, alternatively, a carrier gas can be used to enhance the delivery of the precursor to the process chamber 1. Gas line 14 can provide a carrier gas from gas source 15 to the precursor container 13, and a mass flow controller (MFC) 16 can be used to control the carrier gas flow. When a carrier gas is used, it may be introduced into the lower part of precursor container 13 so as to percolated through the solid $W(CO)_6$ precursor 55. Alternately, the carrier gas may be introduced into the precursor source 13 and distributed across the top of the solid $W(CO)_6$ precursor 55. A sensor 45 is provided for measuring the total gas flow from the precursor container 13. The sensor 45 can, for example, comprise a MFC, and the amount of $W(CO)_6$ precursor delivered to the process chamber 1, can be determined using sensor 45 and mass flow controller 16. Alternately, the sensor 45 can comprise a light absorption sensor to measure the concentration of the $W(CO)_6$ precursor in the gas flow to the process chamber 1.

A bypass line 41 is located downstream from sensor 45 and connects gas line 12 to exhaust line 24. Bypass line 41 is provided for evacuating gas line 12 and for stabilizing the supply of the $W(CO)_6$ precursor to the process chamber 1. In addition, a valve 42, located downstream from the branching of gas line 12, is provided on bypass line 41.

Heaters (not shown) are provided to independently heat gas lines 12, 14, and 41, where the temperatures of the gas lines can be controlled to avoid condensation of the $W(CO)_6$ precursor in the gas lines. The temperature of the gas lines can be controlled from about 20° C. to about 100° C., or from about 25° C. to about 60° C.

Dilution gases can be supplied from gas source 19 to gas line 12 using gas line 18. The dilution gases can be used to dilute the process gas or to adjust the process gas partial pressure(s). Gas line 18 contains a MFC 20 and valves 21. MFCs 16 and 20, and valves 17, 21, and 42 are controlled by controller 40, which controls the supply, shutoff, and the flow of a carrier gas, the $W(CO)_6$ precursor gas, and a dilution gas. Sensor 45 is also connected to controller 40 and, based on output of the sensor 45, controller 40 can control the carrier gas flow through mass flow controller 16 to obtain the desired $W(CO)_6$ precursor flow to the process chamber 1.

Exhaust line 24 connects exhaust chamber 23 to vacuum pumping system 400. Vacuum pump 25 is used to evacuate process chamber 1 to the desired degree of vacuum and to remove gaseous species from the process chamber 1 during processing. An automatic pressure controller (APC) 59 and a trap 57 can be used in series with the vacuum pump 25. The vacuum pump 25 can include a turbo-molecular pump (TMP) capable of a pumping seed up to 5000 liters per second (and greater). Alternately, the vacuum pump 25 can include a dry pump. During processing, the process gas can be introduced into the process chamber 1 and the chamber pressure adjusted by the APC 59. The APC 59 can comprise a butterfly-type valve or a gate valve. The trap 57 can collect unreacted precursor material and by-products from the process chamber 1.

In the process chamber 1, three substrate lift pins 26 (only two are shown) are provided for holding, raising, and lowering the substrate 50. The substrate lift pins 26 are affixed to plate 27, and can be lowered to below to the upper surface of substrate holder 2. A drive mechanism 28 utilizing, for example, an air cylinder, provides means for raising and lowering the plate 27. A substrate 50 can be transferred in and out of process chamber 1 through gate valve 30 and chamber feed-through passage 29 via a robotic transfer system (not shown) and received by the substrate lift pins. Once the substrate 50 is received from the transfer system, it can be lowered to the upper surface of the substrate holder 2 by lowering the substrate lift pins 26.

A processing system controller 500 includes a microprocessor, a memory, and a digital I/O port capable of generating control voltages sufficient to communicate and activate inputs of the processing system 100 as well as monitor outputs from the processing system 100. Moreover, the processing system controller 500 is coupled to and exchanges information with process chamber 1, precursor delivery system 300 that includes controller 40 and precursor heater 13a, vacuum pumping system 400, power source 6, and coolant fluid source 10f. In the vacuum pumping system 400, the processing system controller 500 is coupled to and exchanges information with the automatic pressure controller 59 for controlling the pressure in the process chamber 1. A program stored in the memory is utilized to control the aforementioned components of a processing system 100 according to a stored process recipe. One example of processing system controller 500 is a DELL PRECISION WORKSTATION 610™, available from Dell Corporation, Dallas, Tex.

A processing system for forming W layers can comprise a single wafer process chamber as is schematically shown and described in FIG. 1. Alternately, the processing system can comprise a batch type process chamber capable of processing multiple substrates (wafers) simultaneously. In addition to semiconductor substrates, e.g., Si wafers, the substrates can, for example, comprise LCD substrates, glass substrates, or compound semiconductor substrates. The process chamber can, for example, process substrates of any size, such as 200 mm substrates, 300 mm substrates, or even larger substrates.

In general, various metal barriers/liners from the corresponding metal-carbonyl precursors can be deposited. This includes deposition of W, Ni, Mo, Co, Rh, Re, Cr, and Ru metal layers from $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$ precursors, respectively. The low-temperature deposition of low-resisitivity metal layers allows integration of metal layers into back-end-of-line (BEOL) processing schemes that require substrate temperatures between about 400° C. and about 500° C., or lower.

A metal layer can be thermally deposited from a metal-containing precursor without the use of a reducing gas. Alternately, a reducing agent, e.g. a $H_2$ gas, can be employed to aid in the deposition of the metal layer. Thermal decomposition of metal-carbonyl precursors and subsequent metal deposition, is thought to proceed predominantly by CO elimination and desorption of CO by-products from the substrate. Incorporation of CO by-products into the metal layers can result from incomplete decomposition of the metal-carbonyl precursor, incomplete removal of CO by-products from metal layer, and re-adsorption of CO by-products from the processing zone onto the metal layer. Lowering of the process pressure results in a shorter residence of gaseous species (e.g., metal-carbonyl precursor, reaction by-products, carrier gas, and dilution gas) in the processing zone above the substrate, which in turn, can result in lower CO impurity levels in metal layers deposited on the substrate. In addition, lowering the partial pressure of the metal-carbonyl precursor in the processing zone, can results in a lower deposition rate of the metal layer. A lower deposition rate can reduce the amount of reaction by-products that can become incorporated (trapped) in the metal layer, by allowing more time for the by-products to desorb from the metal layer.

The residence time of the gaseous species in the processing zone was calculated by dividing the volume of the processing zone by the total process gas flow. The process zone is defined by the substrate diameter and the gap between the substrate and the showerhead. The gaseous species can include the metal-carbonyl precursor, a carrier gas, a dilution gas, and reaction by-products (e.g., CO). The residence time of the gaseous species in the processing zone can, for example, be varied by varying the process gas flow, varying the gap between the substrate and the showerhead, and varying the pumping speed of the process chamber using an APC. In the processing system shown in FIG. 1, the residence time in the processing zone could be varied from about 2 msec to greater than about 120 msec using a gap of about 10 mm to about 100 mm.

Figure 2:
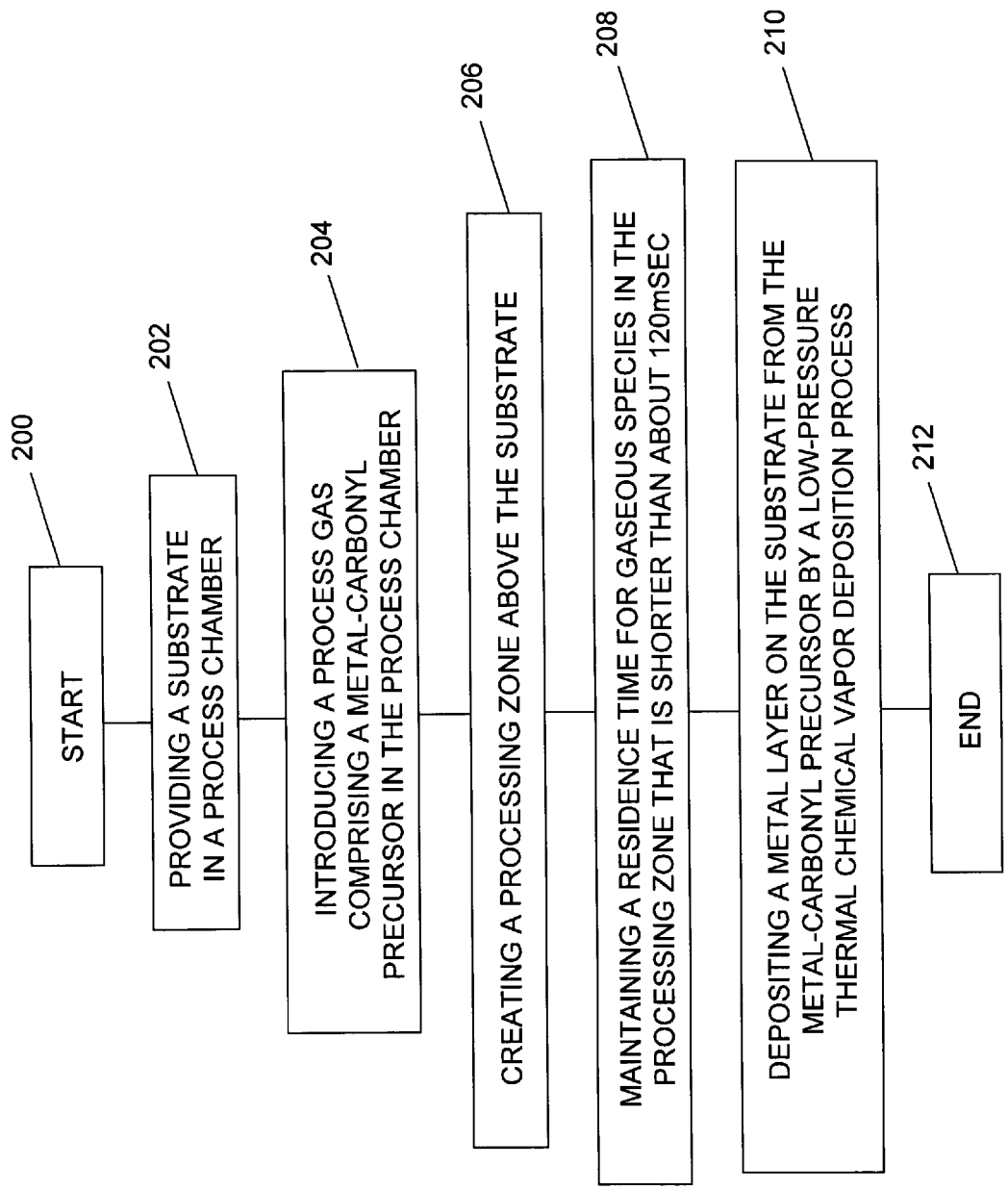
FIG. 2 shows a flowchart for depositing a metal layer according to an embodiment of the invention.

FIG. 2 shows a flowchart for depositing a metal layer according to an embodiment of the invention. In 200, the process is started. In 202, a substrate is provided in a process chamber. In 204, a process gas comprising a metal-carbonyl precursor and optionally a carrier gas and a dilution gas, is introduced in the process chamber. In 206, a processing zone is created above the substrate. In 208, a residence time that is shorter than about 120 msec is maintained in the processing zone, and in 210 a metal layer is deposited on the substrate by a low-pressure TCVD deposition process, wherein the short residence time of the gaseous species in the processing zone enables formation of a low-resistivity metal layer. In 212, the process ends.

Figure 3:
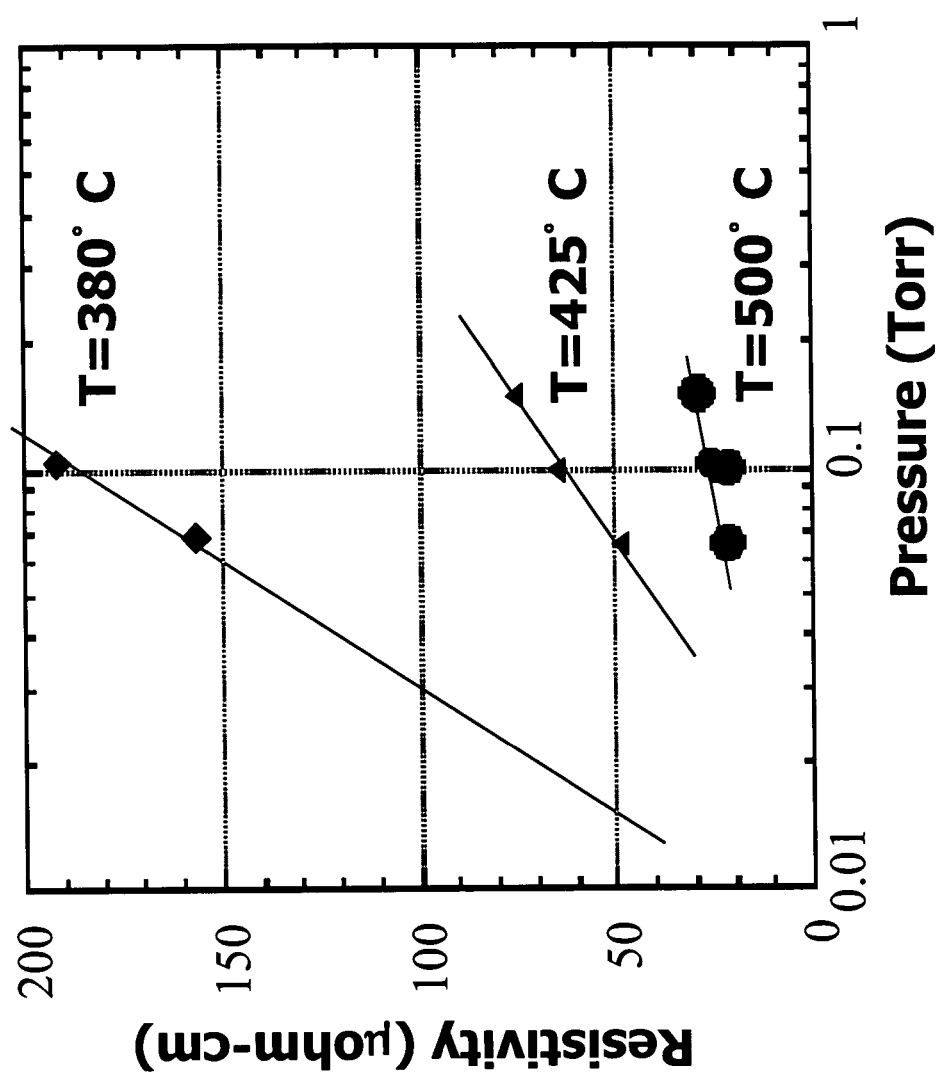
FIG. 3 shows resistivity of W layers deposited by a low-pressure TCVD process as a function of process pressure according to an embodiment of the invention.

FIG. 3 shows resistivity of W layers deposited by a low-pressure TCVD process as a function of process pressure according to an embodiment of the invention. The W layers were deposited onto $SiO_2$ layers from thermal decomposition of a $W(CO)_6$ precursor at three different substrate temperatures; about 500° C., about 425° C., and about 380° C.

FIG. 3 illustrates that the resisitivity of a W layer that is deposited from thermal decomposition of a $W(CO)_6$ precursor decreases as the process pressure is lowered. Extrapolation of the 380° C. and 425° C. data to lower process pressures shows that process pressures of about 13 mTorr and about 66 mTorr, respectively, are required to deposit W layers with resistivities of about 50 $\mu$ohm-cm. Furthermore, W layers deposited at a substrate temperature of about 500° C. show resistivities of about 25 $\mu$ohm-cm, or less, for process pressures below about 100 mTorr. In FIG. 3, the W deposition rate decreased with decreasing process pressure from about 62 Å/min at a pressure of about 0.1 Torr to about 44 Å/min at a pressure of about 0.07 Torr for a substrate temperature of about 380° C., from about 37 Å/min at a pressure of about 0.15 Torr to about 23 Å/min at a pressure of about 0.07 Torr for a substrate temperature of about 425° C., and from about 93 Å/min at a pressure of about 0.15 Torr to about 82 Å/min at a pressure of about 0.07 Torr for a substrate temperature of about 500° C.

The resistivity results in FIG. 3 show that W layers with low resistivity can be deposited by a low-pressure TCVD process at substrate temperatures between about 400° C. and about 500° C., and lower.

Figure 4:
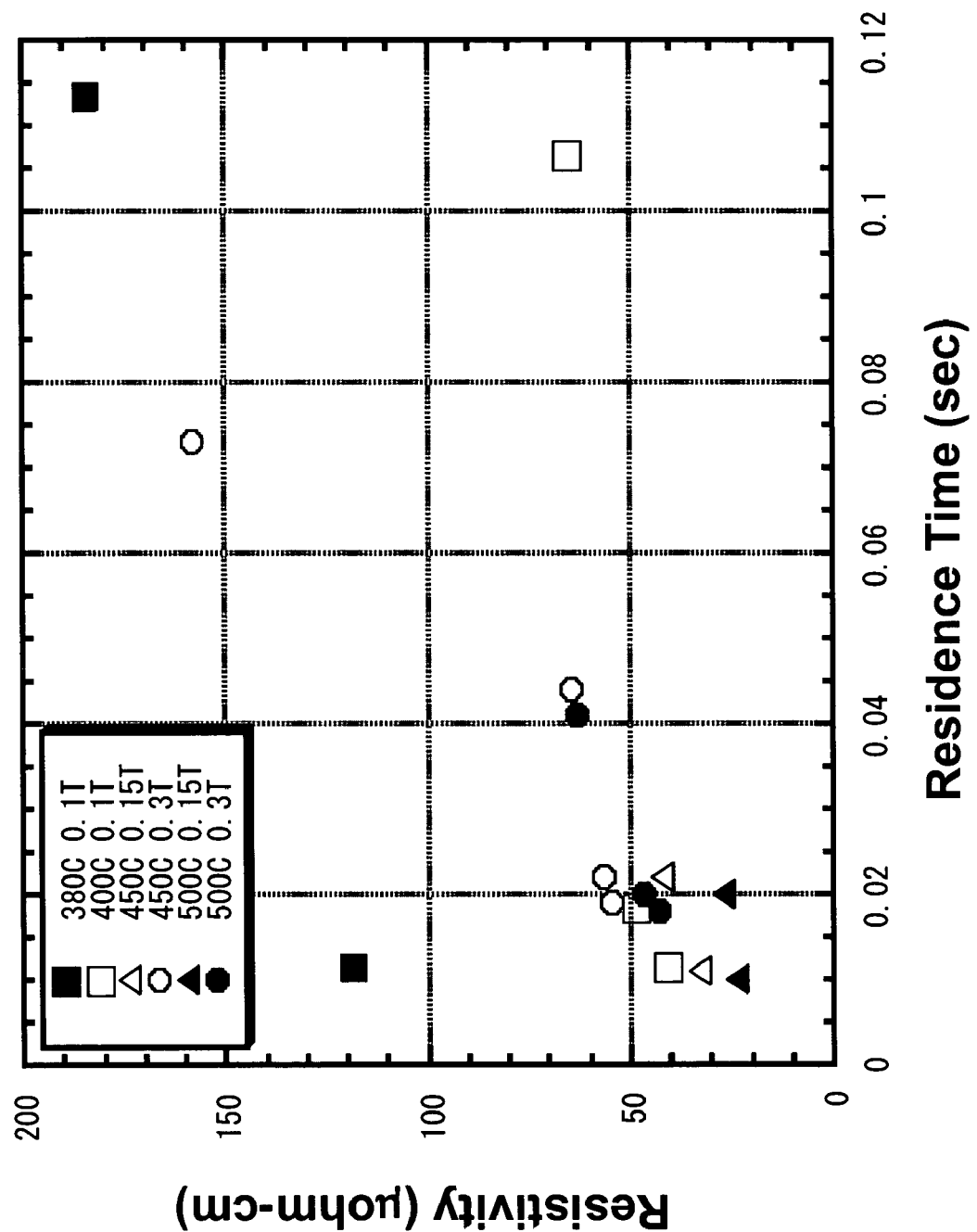
FIG. 4 shows resistivity of W layers deposited by a low-pressure TCVD process as a function of residence time of gaseous species in the processing zone according to an embodiment of the invention.

FIG. 4 shows resistivity of W layers deposited by a low-pressure TCVD process as a function of residence time of gaseous species in the processing zone according to an embodiment of the invention. The W layers were deposited onto $SiO_2$ layers at substrate temperatures between about 380° C. and about 500° C., and process pressures between about 100 mTorr and about 300 mTorr.

The data in FIG. 4 shows that W layers with low resistivities were deposited when the residence time in the processing zone was less than about 120 msec and the substrate temperature was between about 400° C. and about 500° C. The data shows that the resistivity of the W layers decreases as the residence time of the gaseous species in the processing zone becomes shorter. Furthermore, it is generally observed that for a given residence time, lower process pressure and higher substrate temperature results in lower resisitivity W layers.

Figure 5:
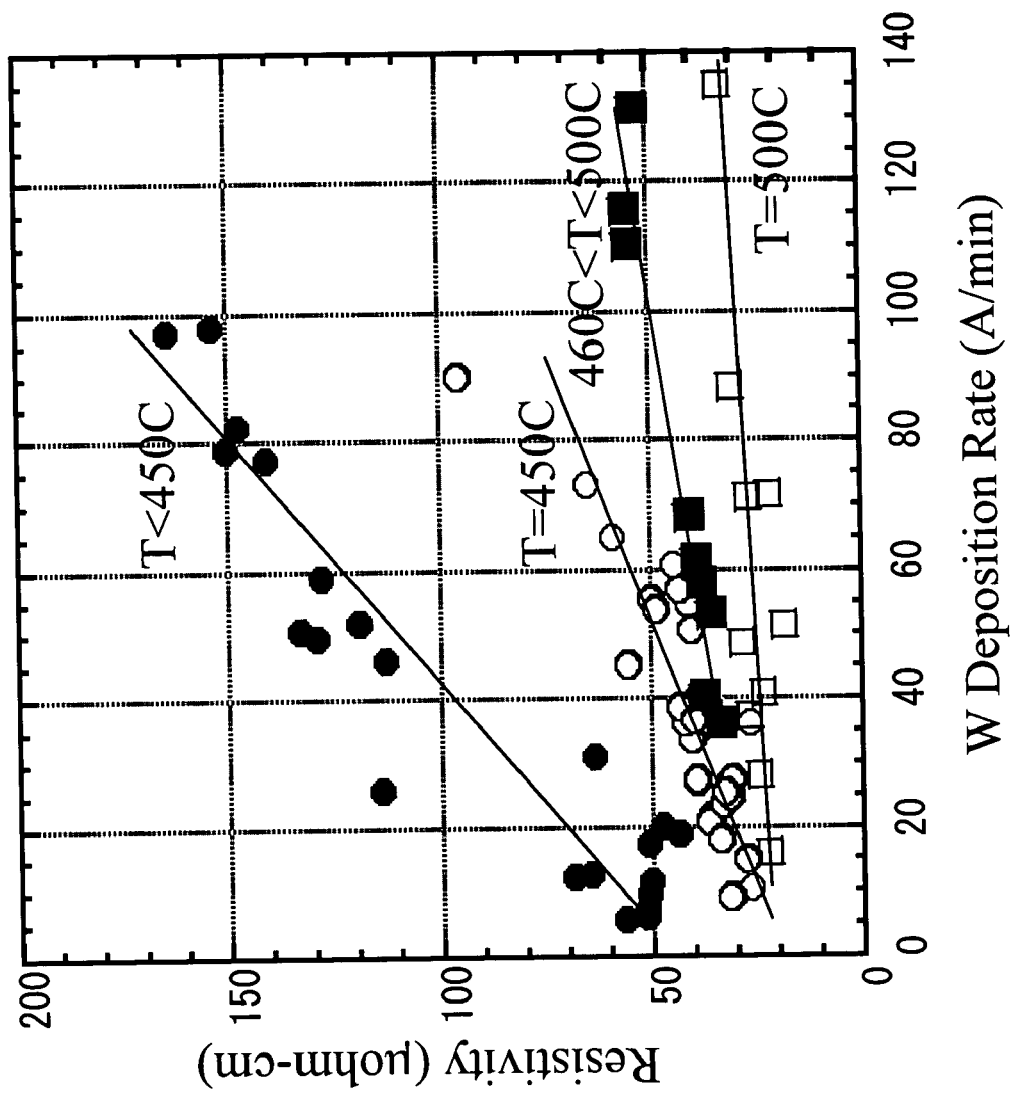
FIG. 5 shows resisitivity of W layers deposited by a low-pressure TCVD process as a function of W deposition rate according to an embodiment of the invention.

The process parameter space for the TCVD process can, for example, utilize a chamber pressure less than about 300 mTorr. Alternately, the pressure can be less than about 100 mTorr. The residence time in the processing zone can, for example, be less than about 120 msec. Alternately, the residence time can be less than about 70 msec. Furthermore, the residence time can be less than about 40 msec. A metal-carbonyl precursor flow rate can be between about 0.1 sccm to about 200 sccm, a carrier gas flow rate can be less than about 500 sccm, and a dilution gas flow rate can be less than about 2000 sccm. A carrier gas and a dilution gas can comprise at least one of an inert gas and a $H_2$ gas. The inert gas can comprise at least one of Ar, He, Ne, Kr, Xe, and $N_2$. The substrate temperature can be varied from about 300° C. to about 600° C. FIG. 5 shows resisitivity of W layers deposited by a low-pressure TCVD process as a function of W deposition rate according to an embodiment of the invention. FIG. 5 shows that the resistivity of the deposited W layers decreases with decreasing W deposition rate. The W deposition rate can be decreased by, for example, reducing the chamber pressure, lowering the carrier gas flow, increasing a dilution gas flow, and reducing the temperature of the precursor container. For example, to achieve resistivity of less than about 50 $\mu$ohm-cm, the W deposition rate must be less than about 20 A/min for a substrate temperature of less than about 450° C., less than about 60 A/min for a substrate temperature of about 450° C., and less than about 100 A/min for a substrate temperature between about 460° C. and about 500° C.

Figure 6:
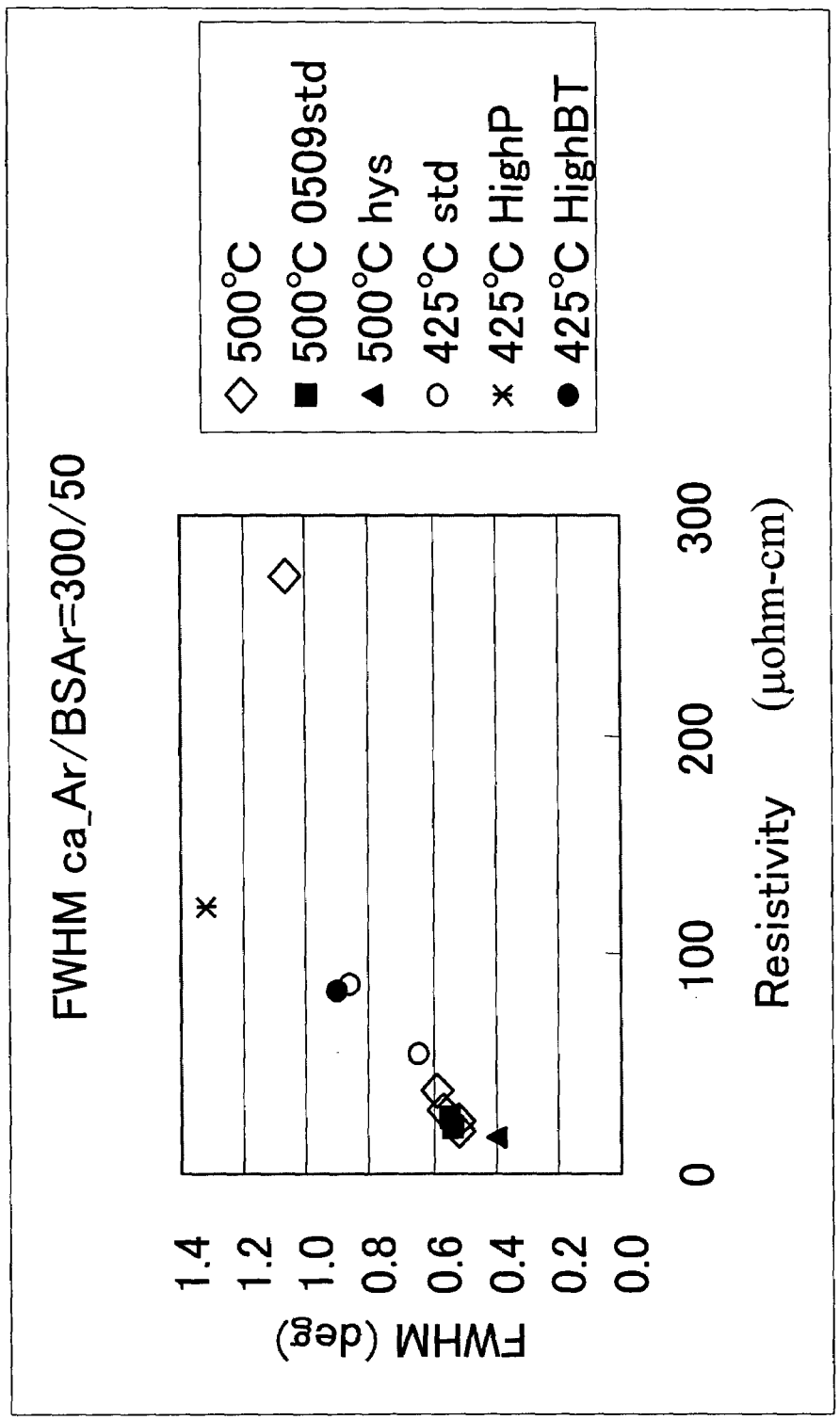
FIG. 6 shows XRD measurements as a function of resistivity of W layers according to an embodiment of the invention.

FIG. 6 shows X-ray diffraction (XRD) measurements as a function of resistivity of deposited W layers. The W layers were deposited using an Ar carrier gas flow of about 300 sccm and an Ar dilution gas flow of about 50 sccm. The XRD measurements (using a Cu K$\alpha$ X-ray source) show that full width at half-maximum (FWHM) of W peaks at 40.3 degrees, decreases with decreasing resistivity of the W layers. The measured FWHM is a measure of the W layer crystallinity, where lower FWHM values show higher W layer crystallinity. Furthermore, it was observed that adhesion of the deposited W layers to the underlying substrate, using a tape test method, improved with increasing W layer crystallinity.

Table I shows process conditions and results for W layers deposited by a low-pressure TCVD process according to an embodiment of the invention. The W layers were deposited on thermally grown $SiO_2$ layers at a substrate temperature of about 410° C. and a process pressure of about 0.2 Torr. The deposition time in Run I was about 150 sec and about 250 sec in Run II. The average resistivity was normalized to a W layer thickness of 500 A ($R_{500A}$).

TABLE I

|  | Run I | Run II |
| --- | --- | --- |
| Ar Carrier Gas Flow (sccm) | 100 | 100 |
| Dilution Gas Flow (sccm) | 800 | 800 |
| Deposition Time (sec) | 150 | 250 |
| Deposition Rate (A/min) | 18.7 | 19.8 |
| Layer Thickness (A) | 47 | 82 |
| Average Resistivity | 61.9 $\mu$ohm-cm | |

Figure 7B:
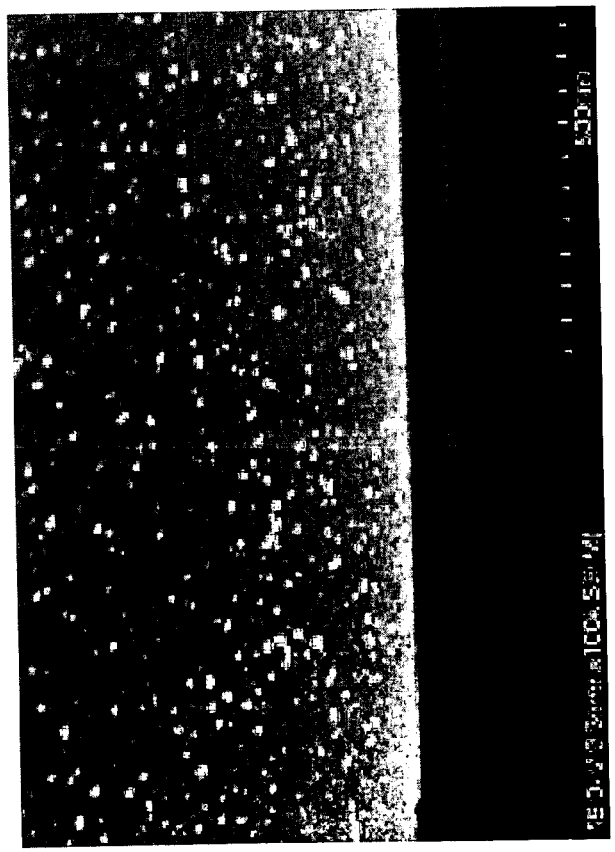
FIGS. 7A and 7B show cross-sectional SEM micrographs (tilted 30 deg) for W layers deposited by a low-pressure TCVD process according to the process conditions listed in TABLE I for Runs I and II, respectively.
Figure 7A:
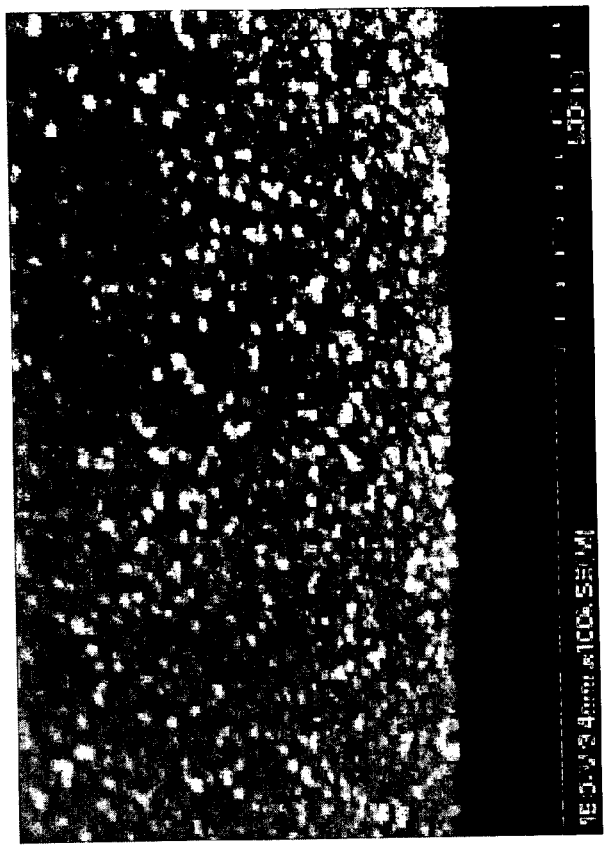

FIGS. 7A and 7B show cross-sectional SEM micrographs (tilted 30 deg) for W layers deposited by a low-pressure TCVD process according to the process conditions listed in TABLE I for Runs I and II, respectively. Comparison of the W layers FIGS. 7A and 7B shows that the surface of the thicker W layer in FIG. 7B is rougher and contains a larger number of nodules than the surface of the thinner W layer in FIG. 7A.

Table II shows process conditions and results for W layers deposited by a low-pressure TCVD process according to an embodiment of the invention. The deposition time in Run III was 600 sec and 1200 sec in Run IV.

TABLE II

|  | Run III | Run IV |
| --- | --- | --- |
| Ar Carrier Gas Flow | 20 sccm | 20 sccm |
| Dilution Gas Flow | 880 sccm | 880 sccm |
| Deposition Time | 600 sec | 1200 sec |
| Deposition Rate | 4.4 A/min | 4.7 A/min |
| Layer Thickness | 44A | 95A |
| Average Resistivity | 39.6 $\mu$ohm-cm | |

Figure 8B:
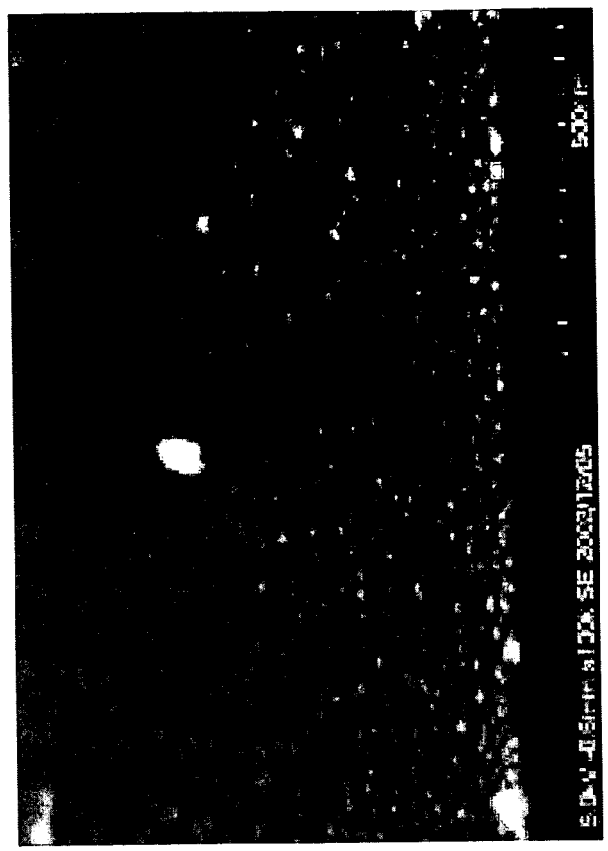
FIGS. 8A and 8B show cross-sectional SEM micrographs (tilted 30 deg) for W layers deposited by a low-pressure TCVD process according to the process conditions listed in TABLE II for Runs III and IV, respectively.
Figure 8A:
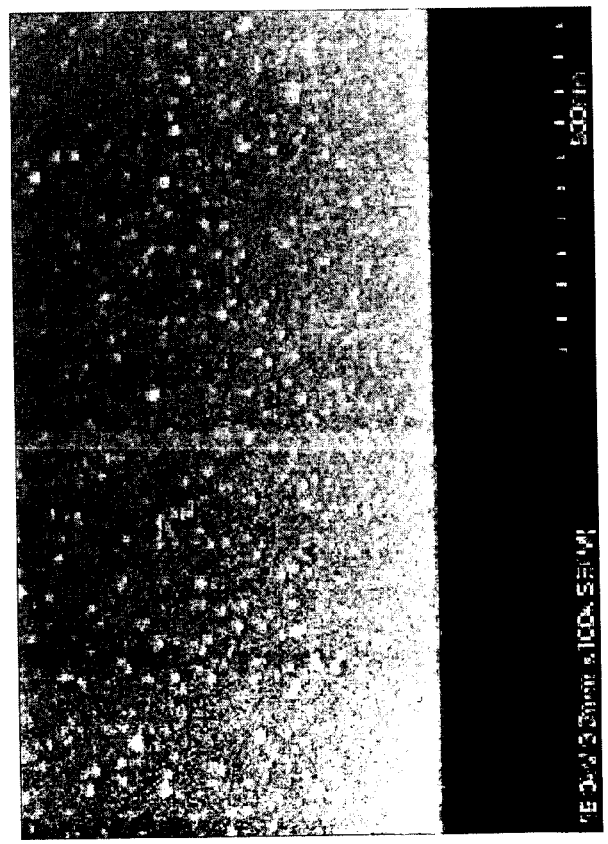

FIGS. 8A and 8B show cross-sectional SEM micrographs (tilted 30 deg) for W layers deposited by a low-pressure TCVD process according to the process conditions listed in TABLE II for Runs III and IV, respectively. Comparison of the W layers in FIGS. 8A and 8B shows that the surface of the thicker W layer in FIG. 8B is rougher and contains a larger number of nodules than the surface of the thinner W layer in FIG. 8A.

Further comparison of the data in Tables I and II and FIGS. 7A through 8B shows that the number of nodules and the layer resistivity decrease as the W deposition rate decreases.

Figure 9B:
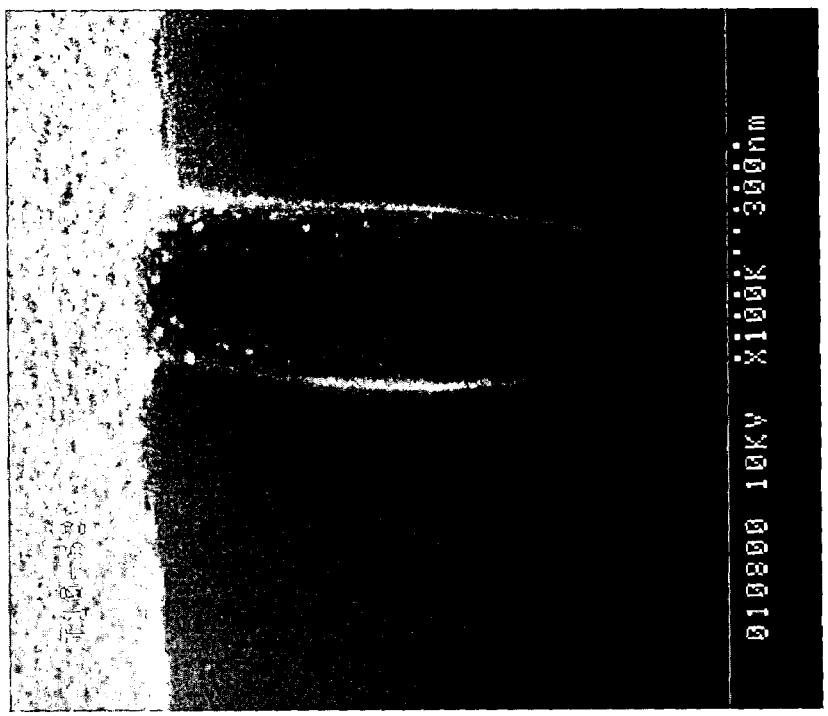
FIGS. 9A and 9B show cross-sectional SEM micrographs (tilted 30 deg) for W layers deposited by a low-pressure TCVD process according to an embodiment of the invention.
Figure 9A:

FIGS. 9A and 9B show cross-sectional SEM micrographs (tilted 30 deg) for W layers deposited by a low-pressure TCVD process according to an embodiment of the invention. The W layer illustrated in FIG. 9A was deposited using a process pressure of about 0.5 Torr, and a precursor container temperature of about 60° C. The resistivity of the approximately 600 A thick W layer was about 189 $\mu$ohm-cm ($R_{500A}$=207 $\mu$ohm-cm). The W layer illustrated in FIG. 9B was deposited using a process pressure of about 0.06 Torr, and a precursor container temperature of about 30° C. The resistivity of the approximaterly 275 A thick W layer was about 52 $\mu$ohm-cm ($R_{500A}$=55 $\mu$ohm-cm). A visual comparison of FIGS. 9A and 9B shows that a smoother W layer can be deposited when the process pressure is lowered from about 0.5 Torr to about 0.06 Torr.

The following examples further illustrate deposition of low-resistivity W layers.

EXAMPLE 1

W Layer Deposition at About 500° C. and About 100 mTorr

A W layer was deposited on a substrate containing a 100 nm thick thermal oxide ($SiO_2$) layer. The substrate was heated to about 500° C. and a gap of about 50 mm was used between the substrate and the showerhead. A precursor container containing the $W(CO)_6$ precursor was maintained at about 40° C., and about 50 sccm of Ar carrier gas was used to deliver the precursor the processing chamber. The process pressure was maintained at about 100 mTorr during the W layer deposition using an APC. The residence time of the gaseous species in the processing zone was about 83 msec. The process gas was exposed to the substrate for about 700 sec and resulted in deposition of an about 126 nm thick W layer onto the oxide layer. The resistivity of the W layer was about 23.5 ohm-cm, and the W layer showed good adhesion to the underlying oxide layer in a tape test.

EXAMPLE 2

W Layer Deposition at About 500° C. and About 50 mTorr

The process conditions were the same as in EXAMPLE 1 except that the process pressure was maintained at 50 mTorr during the W layer deposition. This resulted in a residence time of about 41 msec. The deposited W layer had a measured resistivity of about 20.1 $\mu$ohm-cm, and the W layer showed good adhesion to the underlying oxide layer in a tape test.

EXAMPLE 3

W Layer Deposition at About 390° C. and About 50 mTorr

The process conditions included a substrate temperature of about 390° C., a processing pressure of about 50 mTorr, a Ar carrier gas flow rate of about 50 sccm, an Ar dilution gas flow rate of about 100 sccm, and a gap of about 50 mm. The residence time in the processing zone was about 15 msec, and the W deposition rate was about 12 A/min. The deposited W layer had a measured resistivity of about 44.4 μohm-cm, and the W layer showed good adhesion to the underlying oxide layer in a tape test.

EXAMPLE 4

W Layer Deposition at About 400° C. and About 140 mTorr

The process conditions included a substrate temperature of about 400° C., a processing pressure of about 140 mTorr, an Ar carrier gas flow of about 20 sccm, an Ar dilution gas flow rate of about 1,030 sccm, and a gap of about 50 mm. The residence time in the processing zone was about 15 msec, and the W deposition rate was about 7 A/min. The deposited W layer had a measured resistivity of about 54 μohm-cm, and the W layer showed good adhesion to the underlying oxide layer in a tape test.

EXAMPLE 5

W Layer Deposition at About 425° C. and About 500 mTorr

The process conditions included a substrate temperature of about 425° C., a processing pressure of about 500 mTorr, an Ar carrier gas flow rate of about 50 sccm, and a gap of about 50 mm. The residence time in the processing zone was about 413 msec, and the W deposition rate was about 79 A/min. The deposited W layer had a measured resistivity of about 194.6 μohm-cm, and the W layer showed poor adhesion to the underlying oxide layer in a tape test. EXAMPLE 5 shows that a long residence time (about 413 msec) results in a W film that has poor electrical and adhesion properties.

The above process examples show the relationship between process conditions and the W layer properties. The examples show that W layers with good properties, that include low resistivity and good adhesion to underlying oxide layer, can be deposited at substrate temperatures between about 400° C. and about 500° C., and lower, provided that the residence time of gaseous species in the processing zone is short, e.g., shorter than about 120 msec.

It should be understood that various modifications and variations of the present invention may be employed in practicing the invention. It is therefore to be understood that, within the scope of the appended claims, the invention may be practiced otherwise than as specifically described herein.

What is claimed is:

1. A method of depositing a metal layer on a substrate, the method comprising:
   providing a substrate in a process chamber with a showerhead therein;
   introducing a process gas comprising a metal-carbonyl precursor in the process chamber, with a process gas flow rate;
   creating a processing zone above the substrate, the processing zone being a volume defined by a diameter of the substrate and a gap between the substrate and the showerhead;
   maintaining a residence time for gaseous species in the processing zone that is shorter than about 120 msec, the residence time being proportional to the volume of the processing zone and the process gas flow rate; and
   depositing a metal layer on the substrate by a thermal chemical vapor deposition process.

2. The method according to claim 1, wherein the residence time of gaseous species in the processing zone is shorter than about 70 msec.

3. The method according to claim 1, wherein the residence time of gaseous species in the processing zone is shorter than about 40 msec.

4. The method according to claim 1, wherein the process chamber pressure is less than about 300 mTorr.

5. The method according to claim 1, wherein the process chamber pressure that is less than about 100 mTorr.

6. The method according to claim 1, wherein a metal-carbonyl precursor flow rate is between about 0.1 sccm and about 200 sccm.

7. The method according to claim 1, wherein the substrate temperature is between about 300° C. and about 600° C.

8. The method according to claim 1, wherein the substrate temperature is between about 400° C. and about 500° C.

9. The method according to claim 1, wherein the metal-carbonyl precursor comprises at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$.

10. The method according to claim 1, wherein the metal layer comprises at least one of W, Ni, Mo, Co, Rh, Re, Cr, and Ru.

11. The method according to claim 1, wherein the process gas further comprises at least one of a carrier gas and a dilution gas.

12. The method according to claim 11, wherein the process gas includes the carrier gas having a flow rate less than about 500 sccm.

13. The method according to claim 11, wherein the process gas includes the dilution gas having a flow rate less than about 2000 sccm.

14. The method according to claim 11, wherein the at least one of a carrier gas and a dilution gas comprises at least one of Ar, He, Ne, Kr, Xe, $N_2$, and $H_2$.

15. The method according to claim 1, wherein the gaseous species in the processing zone comprise the metal-carbonyl precursor and reaction by-products.

16. The method according to claim 15, wherein the gaseous species in the processing zone further comprise at least one of a carrier gas and a dilution gas.

17. The method according to claim 1, wherein the substrate comprises at least one of a semiconductor substrate, a LCD substrate, and a glass substrate.

18. A method of depositing a W layer on a substrate, the method comprising:
   providing a substrate in a process chamber with a showerhead therein;
   introducing a process gas comprising a $W(CO)_6$ precursor in the process chamber, with a process gas flow rate;
   creating a processing zone above the substrate, the processing zone being a volume defined by a diameter of the substrate and a gap between the substrate and the showerhead;
   maintaining a residence time for gaseous species in the processing zone that is shorter than about 120 msec, the residence time being proportional to the volume of the processing zone and the process gas flow rate; and
   depositing a W layer on the substrate by a thermal chemical vapor deposition process.

19. The method according to claim 18, wherein the residence time of gaseous species in the processing zone is shorter than about 70 msec.

20. The method according to claim 18, wherein the residence time of gaseous species in the processing zone is shorter than about 40 msec.

21. The method according to claim 18, wherein the process chamber pressure is less than about 300 mTorr.

22. The method according to claim 18, wherein the process chamber pressure that is less than about 100 mTorr.

23. The method according to claim 18, wherein a $W(CO)_6$ precursor flow rate is between about 0.1 sccm and about 200 sccm.

24. The method according to claim 18, wherein the substrate temperature is between about 300° C. about 600° C.

25. The method according to claim 18, wherein the substrate temperature is about 400° C.

26. The method according to claim 18, wherein the process gas further comprises at least one of a carrier gas and a dilution gas.

27. The method according to claim 26, wherein the process gas includes the carrier gas having a flow rate less than about 500 sccm.

28. The method according to claim 26, wherein the process gas includes the dilution gas having a flow rate less than about 2000 sccm.

29. The method according to claim 26, wherein the at least one of a carrier gas and a dilution gas comprises at least one of Ar, He, Ne, Kr, Xe, $N_2$, and $H_2$.

30. The method according to claim 18, wherein the gaseous species in the processing zone comprise the $W(CO)_6$ precursor and reaction by-products.

31. The method according to claim 18, wherein the gaseous species in the processing zone further comprise at least one of a carrier gas and a dilution gas.

32. The method according claim 18, wherein the substrate comprises at least one of a semiconductor substrate, a LCD substrate, and a glass substrate.

* * * * *